(12) United States Patent
Lee et al.

(10) Patent No.: US 12,386,690 B2
(45) Date of Patent: Aug. 12, 2025

(54) FAIL DATA AUGMENTATION DEVICE AND METHOD FOR RANDOM ACCESS MEMORY

(71) Applicant: SK hynix Inc., Gyeonggi-do (KR)

(72) Inventors: Seung Yeol Lee, Gyeonggi-do (KR); Jung Soo Kim, Gyeonggi-do (KR); Chang Hoon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 45 days.

(21) Appl. No.: 18/406,922

(22) Filed: Jan. 8, 2024

(65) Prior Publication Data
US 2025/0068500 A1    Feb. 27, 2025

(30) Foreign Application Priority Data

Aug. 22, 2023 (KR) .......................... 10-2023-0109768

(51) Int. Cl.
*G06F 11/00* (2006.01)
*G06F 11/07* (2006.01)

(52) U.S. Cl.
CPC .......... *G06F 11/079* (2013.01); *G06F 11/073* (2013.01)

(58) Field of Classification Search
CPC .............................. G06F 11/073; G06F 11/079
See application file for complete search history.

(56) References Cited

U.S. PATENT DOCUMENTS

| | | | |
|---|---|---|---|
| 5,349,579 A * | 9/1994 | Madonna | H04Q 3/625 370/259 |
| 11,170,585 B2 | 11/2021 | Sankavaram et al. | |
| 2014/0064247 A1* | 3/2014 | Teyeb | H04W 36/008375 370/331 |
| 2021/0049452 A1* | 2/2021 | Fan | G06N 3/049 |
| 2023/0161655 A1* | 5/2023 | Schlichting | G06F 11/008 706/21 |
| 2024/0071506 A1* | 2/2024 | Xu | G11C 29/021 |
| 2024/0143993 A1* | 5/2024 | Schneuwly | G06N 3/08 |
| 2024/0176714 A1* | 5/2024 | Diao | G11C 29/52 |
| 2024/0281718 A1* | 8/2024 | Lai | G06F 11/30 |
| 2024/0345914 A1* | 10/2024 | Selvaraj | G05B 19/042 |
| 2025/0036509 A1* | 1/2025 | We | G06F 11/0739 |
| 2025/0036514 A1* | 1/2025 | Gu | G06F 11/073 |

FOREIGN PATENT DOCUMENTS

KR 20190142540 A 12/2019

* cited by examiner

*Primary Examiner* — Joshua P Lottich
(74) *Attorney, Agent, or Firm* — IP & T GROUP LLP

(57) ABSTRACT

A fail data augmentation device may input a plurality of fail data units to a data augmentation model, obtain a plurality of augmented fail data units outputted from the data augmentation model, and delete one or more of the augmented fail data units. The plurality of fail data units and the plurality of augmented fail data units includes a first parameter indicating one of a plurality of banks included in a random access memory, a second parameter indicating one of a plurality of matrices included in the bank corresponding to the first parameter, and a third parameter indicating one of a plurality of hex units included in the matrix corresponding to the second parameter respectively.

13 Claims, 9 Drawing Sheets

FIG.8

| | PARA_1 | PARA_2 | PARA_3 |
|---|---|---|---|
| FAIL_DU | 3 | 9 | 0 |
| FAIL_DU | 4 | 20 | 0 |
| FAIL_DU | 1 | 13 | 0 |
| FAIL_DU | 7 | 8 | 0 |
| ... | | | |

PARA_3 : (0)

| | PARA_1 | PARA_2 | PARA_3 |
|---|---|---|---|
| AUG_FAIL_DU | 2 | 20 | 0 |
| AUG_FAIL_DU | 4 | 13 | 0 |
| AUG_FAIL_DU | 3 | 4 | 0 |
| AUG_FAIL_DU | 7 | 18 | 0 |
| AUG_FAIL_DU | 3 | 9 | 1 |
| AUG_FAIL_DU | 5 | 8 | 0 |
| AUG_FAIL_DU | 3 | 12 | 0 |
| AUG_FAIL_DU | 1 | 7 | -1 |
| ... | | | |

→ (delete)
→ (delete)

FAIL DATA AUGMENTATION DEVICE AND METHOD FOR RANDOM ACCESS MEMORY

CROSS-REFERENCES TO RELATED APPLICATION

The present application claims priority under 35 U.S.C. 119 (a) to Korean patent application number 10-2023-0109768 filed on Aug. 22, 2023, which is incorporated herein by reference in its entirety.

BACKGROUND

1. Technical Field

Various embodiments generally relate to a fail data augmentation device and a fail data augmentation method for a random access memory.

2. Related Art

With the advancement of artificial intelligence (AI) technology such as machine learning and deep learning, it is possible to analyze failure in various types of random access memories through artificial intelligence. In order to analyze failure in a random access memory through artificial intelligence, a large amount of fail data is needed.

However, due to an Error Correction Code (ECC), product advancement, and the like, the frequency of failure in a random access memory is significantly decreasing. Therefore, it is difficult to secure the fail data needed to analyze failure in a random access memory.

SUMMARY

Embodiments of the present disclosure may provide a fail data augmentation device and a fail data augmentation method capable of easily obtaining fail data needed to analyze failure in a random access memory.

In one aspect, embodiments of the present disclosure may provide a fail data augmentation device including i) a memory configured to store a plurality of fail data units for a target random access memory and a data augmentation model that inputs the plurality of fail data units and outputs a plurality of augmented fail data units, and ii) a processor configured to execute instructions for inputting the plurality of fail data units to the data augmentation model, obtaining the plurality of augmented fail data units output from the data augmentation model, and deleting one or more of the plurality of augmented fail data units.

The target random access memory may include a plurality of banks, each of the plurality of banks may include a plurality of matrices, and each of the plurality of matrices may include a plurality of hex units.

Each of the plurality of fail data units and the plurality of augmented fail data units may include a first parameter indicating one of the plurality of banks, a second parameter indicating one of the plurality of matrices included in the bank corresponding to the first parameter, and a third parameter indicating one of the plurality of hex units corresponding to the matrix included in the second parameter.

In another aspect, embodiments of the present disclosure may provide a fail data augmentation method including i) inputting a plurality of fail data units for a target random access memory to a data augmentation model, ii) obtaining a plurality of augmented fail data units output from the data augmentation model, and iii) deleting one or more of the plurality of augmented fail data units.

The target random access memory may include a plurality of banks, each of the plurality of banks may include a plurality of matrices, and each of the plurality of matrices may include a plurality of hex units.

Each of the plurality of fail data units and the plurality of augmented fail data units may include a first parameter indicating one of the plurality of banks, a second parameter indicating one of the plurality of matrices included in the bank corresponding to the first parameter, and a third parameter indicating one of the plurality of hex units included in the matrix corresponding to the second parameter respectively.

In another aspect, embodiments of the present disclosure may provide a fail data augmentation device including i) a memory configured to store a plurality of fail data units for a target random access memory and a data augmentation model, and ii) a processor configured to input a plurality of fail data units into a data augmentation model, obtain a plurality of augmented fail data units output from the data augmentation model, and delete one or more of the plurality of augmented fail data units.

The target random access memory may include several memory areas with a hierarchy, each of the plurality of fail data units and the plurality of augmented fail data units may include several parameter values corresponding to respective memory areas. The one or more of the plurality of augmented fail data units may be deleted according to threshold ranges which are preset for each memory areas and each parameter value According to embodiments of the present disclosure, it is possible to easily obtain fail data needed to analyze failure in a random access memory.

These and other features and advantages of the invention will become apparent from the detailed description of embodiments of the present disclosure and the following figures.

BRIEF DESCRIPTION OF THE DRAWINGS

FIG. 8 is a diagram illustrating an operation in which a processor deletes one or more of a plurality of augmented fail data units based on a third parameter according to an embodiment of the present disclosure.

DETAILED DESCRIPTION

Figure 1:
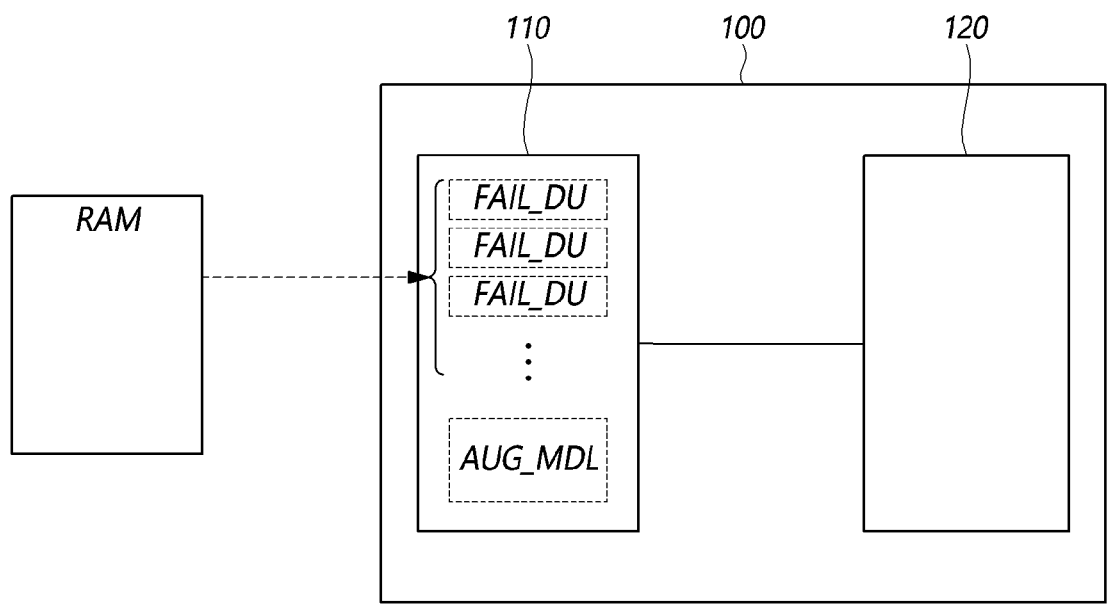
FIG. 1 is a diagram illustrating a schematic structure of a fail data augmentation device according to an embodiment of the present disclosure.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily limited to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout this disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 illustrates a schematic structure of a fail data augmentation device 100 according to an embodiment of the present disclosure.

Referring to FIG. 1, the fail data augmentation device 100 may include a memory 110 and a processor 120.

The memory 110 may store a plurality of fail data units FAIL_DU for a random access memory RAM and a data augmentation model AUG_MDL.

In embodiments of the present disclosure, the random access memory RAM is a target to be analyzed. For example, the random access memory RAM may be a DRAM (e.g., LPDDR5, LPDDR4, DDR5, DDR4), a Multi Chip Package (MCP) DRAM, a DRAM included in Solid State Drive (SSD), or the like.

For example, the random access memory RAM may be included in a specific host. The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, or a mobility device (e.g., a vehicle, a robot or a drone) capable of driving under human control or autonomous driving, as non-limiting examples. Alternatively, the host may be a virtual reality (VR) device providing 2D or 3D virtual reality images or an augmented reality (AR) device providing augmented reality images. In addition, the host may be one of various electronic devices capable of storing data.

The memory 110 may be a volatile memory (e.g., SRAM, DRAM) or a non-volatile memory (e.g., NAND flash). The memory 110 may further store computer-readable software, application, program module, routine, instructions, and/or data that are coded to perform a specific task when executed by the processor 120.

Each of the plurality of fail data units FAIL_DU may indicate information about a failure occurring in the random access memory RAM. The plurality of fail data units FAIL_DU may be data actually obtained from the random access memory RAM.

The data augmentation model AUG_MDL is an artificial intelligence model that inputs the plurality of fail data units FAIL_DU and generates a plurality of augmented fail data units based on the plurality of fail data units FAIL_DU.

The data augmentation model AUG_MDL may be a model already learned based on fail data units for learning, which are preset. Performing learning on the data augmentation model AUG_MDL means adjusting parameters (e.g., weights of nodes included in the data augmentation model AUG_MDL) for the data augmentation model AUG_MDL so that output value for the input data augmentation model AUG_MDL is as similar as possible to actual value.

The learning process of the data augmentation model AUG_MDL may be referred to as training and result of the training may be referred to as learning, but either training or learning may be used to refer to the learning process or the result.

The learning for the data augmentation model AUG_MDL may be performed through the fail data augmentation device 100 or a separate computing device.

For example, the data augmentation model AUG_MDL may be a Synthetic Minority Over-sampling Technique (SMOTE) model or a Generative Adversarial Network (GAN) model.

The SMOTE model is a model that generates new samples by applying k-Nearest Neighbor (k-NN) algorithm to samples that exist at a low rate.

The GAN model is a deep learning-based generative algorithm and may include a generator model and a discriminator model. The generator model may generate new data, and the discriminator model may determine whether the new data is read data (i.e., genuine data) or fake data (i.e., imitation data) generated by the generator model.

However, the data augmentation model AUG_MDL may be implemented based on various artificial intelligence models other than the SMOTE model or GAN model.

The artificial intelligence model may be a current or future machine learning model, such as a model using algorithm-based machine learning or a model using artificial neural network-based learning.

The model using algorithm-based machine learning may be a classic machine learning model such as a tree-based model, k-Nearest Neighbors, k-Means Clustering, Principal Component Analysis (PCA), Support Vector Machine (SVM), or the like.

The tree-based model may be, for example, a decision tree model, a regression model, or a random tree model.

The artificial intelligence model may be an ensemble model that solves problems by learning and combining multiple models rather than using only one learned model.

Ensemble models can prevent an overfitting problem and improve generalization performance by combining several independently learned models. Further, the ensemble models can help improve performance when the performance of individual models cannot be secured.

The ensemble models may be broadly classified into voting method and boosting method.

The voting method is a method of deriving a final result by voting on results generated by multiple models. For example, the voting method may be a bagging method, which combines the same types of algorithms but uses different learning data respectively, and the voting method may combine different types of algorithms.

The boosting method may generate a more accurate and strong machine learning model by combining weak machine learning models. The boosting method is a method in which each weak machine learning model works in order, and weak machine learning models executed later additionally explore parts that are not found by the previous weak machine leaning model. For example, the boosting method may be random forest, gradient boosting, extra Gradient Boost (XGBoost), or the like.

Artificial neural network is a machine learning algorithm that imitates operating principles of human brain, and analyzes and learns complex data based on multiple artificial neurons connected to each other. The artificial neural network may be i) a Multi-Layer Perceptron (MLP), which is the most basic artificial neural network structure consisting of input layer, hidden layer, and output layer, ii) a Convolutional Neural Network (CNN) that performs a convolution operation to extract image features and reduces dimension through a pooling operation, iii) a Recurrent Neural Network (RNN), which is an artificial neural network structure used to process ordered data, or the like. The artificial neural network may be modified in various ways depending on the complexity and diversity of data.

A model that has been trained based on artificial neural network may also be an ensemble model that solves problems by learning and combining multiple models rather than learning and using only one model.

The algorithm-based machine learning model and the artificial neural network-based learning model may be used complementary to each other. For example, the algorithm-based machine learning model may use the result of the artificial neural network-based learning model, and the artificial neural network-based learning model may use the result of the algorithm-based machine learning model. An ensemble model between the algorithm-based machine learning model and the artificial neural network-based learning model may be used.

The processor 120 may input the plurality of fail data units FAIL_DU into the data augmentation model AUG_MDL and obtain a plurality of augmented fail data units output from the data augmentation model AUG_MDL. Through this, the fail data augmentation device 100 may easily secure fail data needed to analyze failure in the random access memory RAM.

To obtain the plurality of augmented fail data units, the processor 120 may load the data augmentation model AUG_MDL stored in the memory 110 and execute instructions for running the data augmentation model AUG_MDL. For example, the instructions may be stored in the memory 110 or in a separate storage device outside the fail data augmentation device 100.

The processor 120 may read and execute computer-readable software, applications, program modules, routines, instructions, and/or data stored in the memory 110.

The processor 120 may be composed of one or more processing units. The one or more processing units may be implemented by a Central Processing Unit (CPU), an Application Processor (AP), a Digital Signal Processor (DSP), a Graphic Processing unit (GPU), a Neural Network Processing Unit (NPU), Application Specific Integrated Circuits (ASICs), Digital Signal Processing Devices (DSPDs), Programmable Logic Devices (PLDs), Field Programmable Gate Arrays (FPGAS), a microprocessor, or the like.

The one or more processing units may execute instructions stored in the memory 110 to perform the above-described operations. Alternatively, the one or more processing units may be designed with a hardware structure specialized for processing the above-described data augmentation model AUG_MDL.

The fail data augmentation device 100 may be implemented by a computing device including the memory 110 and the processor 120 described above.

The computing device may further include a user input device and a presentation device. The user input device may be a means for allowing a user to input a command that causes the processor to execute a specific task or to input data required to execute a specific task. The user input device may include at least one of a physical or virtual keyboard or keypad, key buttons, mouse, joystick, trackball, touch-sensitive input means, microphone, and the like. The presentation device may include at least one of display, printer, speaker, vibrating device, and the like.

The computing device may include at least one of various devices such as smartphone, tablet, laptop, desktop, server, client, and the like. The computing device may be a single stand-alone device or may include multiple devices operating in a distributed environment consisting of multiple devices cooperating with each other through a communication network.

The computing device may be a quantum computing device rather than a classical computing device. The quantum computing device may perform operation in units of Qubit rather than bits. A Qubit may have a superposition state where 0 and 1 overlap simultaneously, and if there are M Qubits, 2^M states can be expressed simultaneously.

The quantum computing device may use at least one of various types of quantum gates (e.g., Pauli/Rotation/Hadamard/CNOT/SWAP/Toffoli) that receive one or more qubits and perform specified operations to perform quantum operations, and may consist of a quantum circuit with a specific function by combining quantum gates.

The quantum computing device may use a quantum artificial neural network (e.g., QCNN, QGRNN), which can perform the function performed by conventional artificial neural network (e.g., CNN, RNN) at a faster speed while using fewer parameters.

Figure 2:
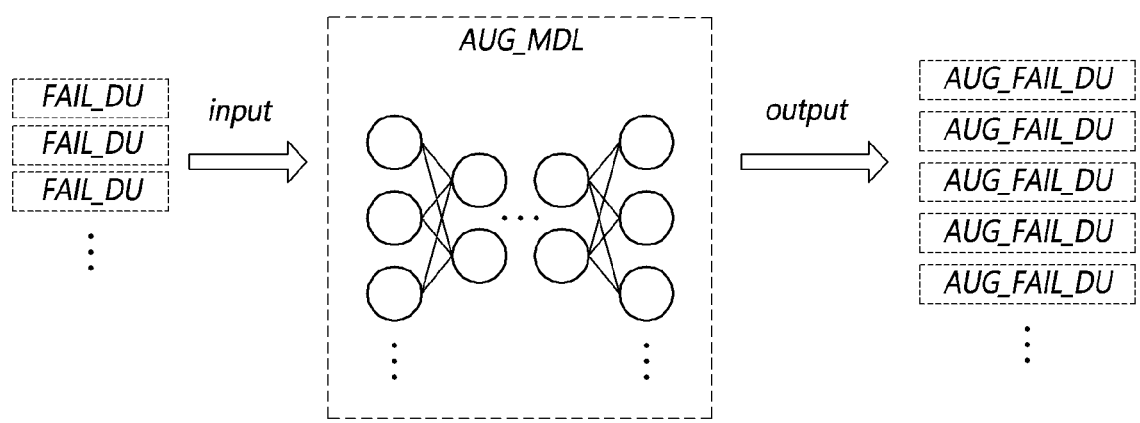
FIG. 2 is a diagram illustrating an operation in which a processor generates a plurality of augmented fail data units according to an embodiment of the present disclosure.

FIG. 2 illustrates an operation in which a processor 120 generates a plurality of augmented fail data units AUG_FAIL_DU according to an embodiment of the present disclosure.

Referring to FIG. 2, the processor 120 may execute instructions for inputting the plurality of fail data units FAIL_DU to the data augmentation model AUG_MDL. The plurality of fail data units FAIL_DU may be input to the data augmentation model AUG_MDL one by one. Alternatively, two or more of the plurality of fail data units FAIL_DU may be input to the data augmentation model AUG_MDL simultaneously.

The data augmentation model AUG_MDL may output the plurality of augmented fail data units AUG_FAIL_DU based on the plurality of input fail data units FAIL_DU. The number N of the output augmented fail data units AUG_FAIL_DU may be greater than the number M of the plurality of input fail data units FAIL_DU.

Hereinafter, the structures of the fail data unit FAIL_DU and the augmented fail data unit AUG_FAIL_DU will be described.

Figure 3:
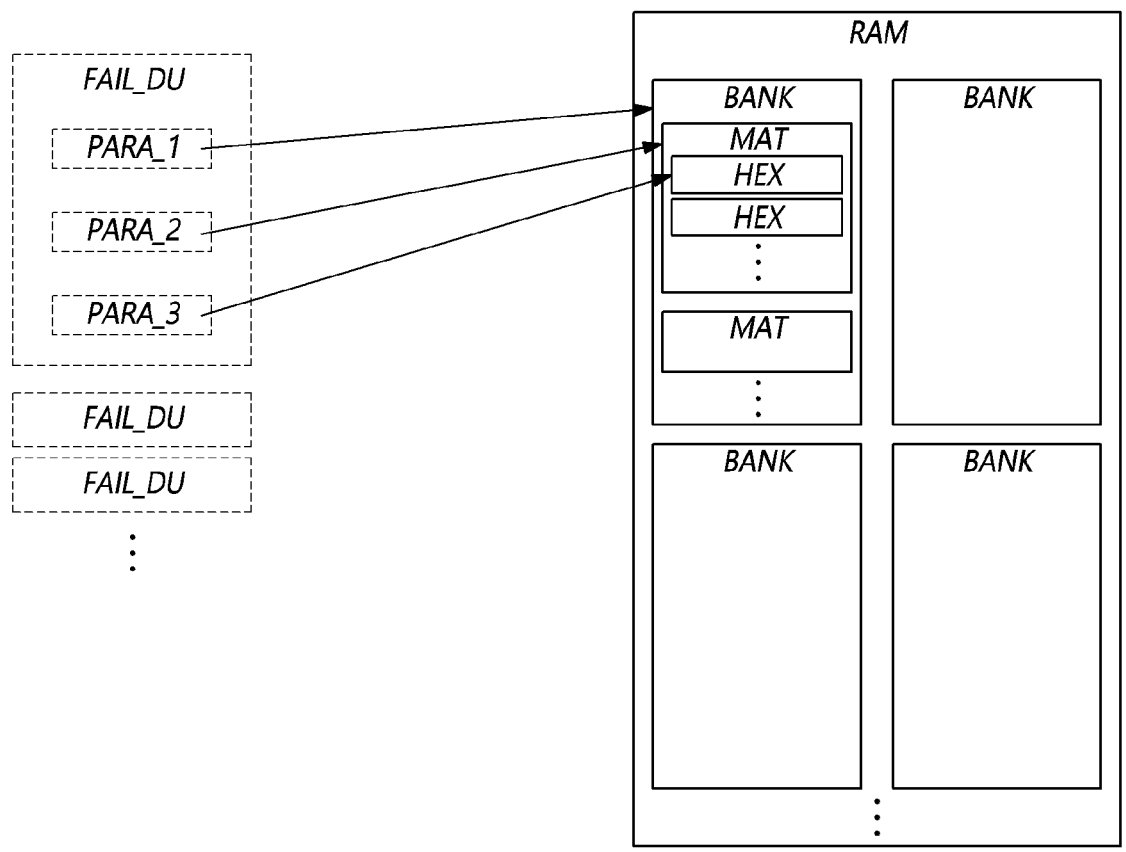
FIG. 3 is a diagram illustrating a structure of fail data unit according to an embodiment of the present disclosure.

FIG. 3 illustrates a structure of a fail data unit FAIL_DU according to an embodiment of the present disclosure.

Referring to FIG. 3, the random access memory RAM may include a plurality of banks BANK.

Each of the plurality of banks BANK may include a plurality of matrices MAT. Each of the plurality of matrices MAT may include a plurality of memory cells.

Each of the plurality of matrices MAT may include a plurality of hex units HEX. The plurality of hex units HEX may correspond to a plurality of memory cells included in the corresponding matrix. The plurality of hex units is sub-units of the corresponding matrix.

Referring to FIG. 3, the fail data unit FAIL_DU may include a first parameter PARA_1, a second parameter PARA_2 and a third parameter PARA_3.

The first parameter PARA_1 may indicate one of the plurality of banks BANK included in the random access memory RAM. That is, the value of first parameter PARA_1 may identify one of the plurality of banks BANK included in the random access memory RAM.

The second parameter PARA_2 may indicate one of the plurality of matrices MAT included in the bank corresponding to the first parameter PARA_1. That is, the value of second parameter PARA_2 may identify one of the plurality of matrices MAT included in the bank corresponding to the first parameter PARA_1.

The third parameter PARA_3 may indicate one of the plurality of hex units HEX included in the matrix corresponding to the second parameter PARA_2. That is, the value of third parameter PARA_3 may identify one of the plurality of hex units HEX included in the matrix corresponding to the second parameter PARA_2.

Figure 4:
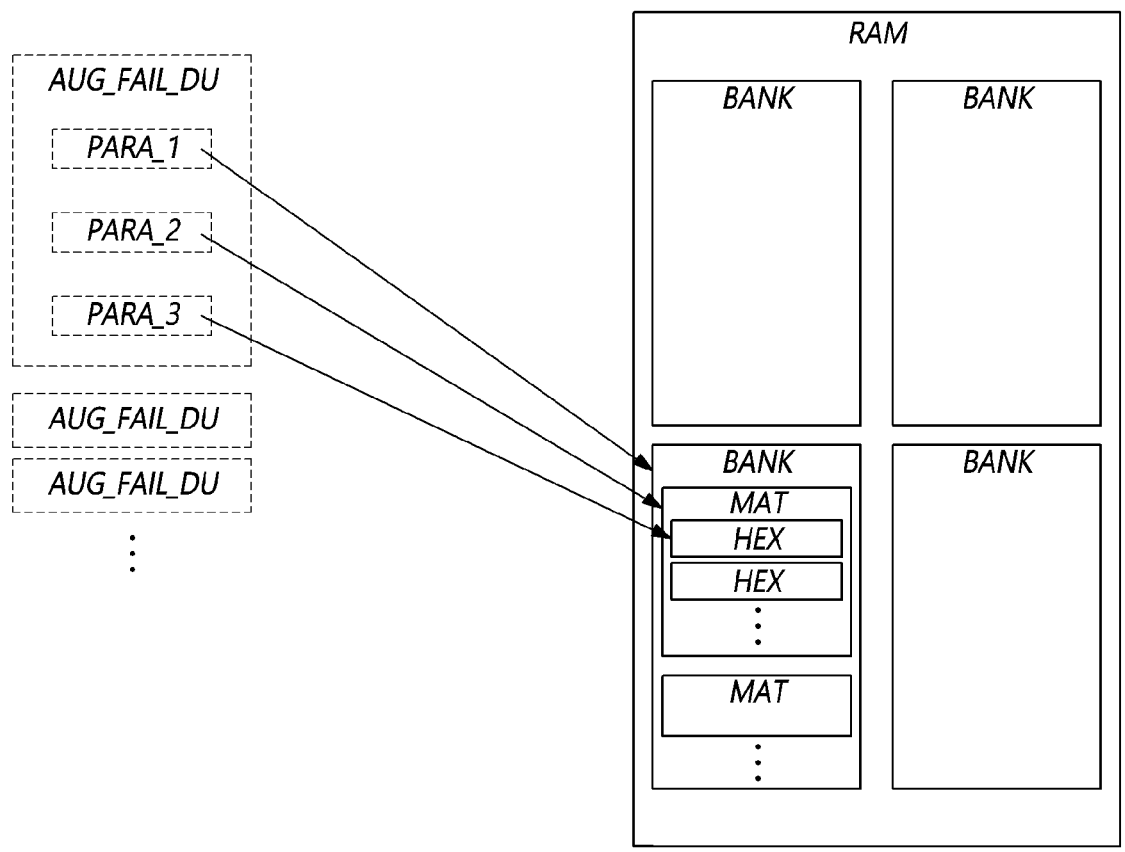
FIG. 4 is a diagram illustrating a structure of augmented fail data unit according to an embodiment of the present disclosure.

FIG. 4 illustrates a structure of an augmented fail data unit AUG_FAIL_DU according to an embodiment of the present disclosure.

Like the fail data unit FAIL_DU illustrated in FIG. 3, the augmented fail data unit AUG_FAIL_DU may also include a first parameter PARA_1, a second parameter PARA_2, and a third parameter PARA_3.

The first parameter PARA_1 may indicate one of the plurality of banks BANK included in the random access memory RAM.

The second parameter PARA_2 may indicate one of the plurality of matrices MAT included in the bank corresponding to the first parameter PARA_1.

The third parameter PARA_3 may indicate one of the plurality of hex units HEX included in the matrix corresponding to the second parameter PARA_2.

Each of the fail data unit FAIL_DU and the augmented fail data unit AUG_FAIL_DU may further include additional information other than the above-described first parameter PARA_1, second parameter PARA_2, and third parameter PARA_3.

For example, each of the fail data unit FAIL_DU and the augmented fail data unit AUG_FAIL_DU may further include at least one of a row address, a column address, channel information, main word line information, sub word line control signal, chip select information and data information.

In the above, the operation of the processor 120 to generate augmented fail data units AUG_FAIL_DU has been described.

Hereinafter, an operation of the processor 120 deleting one or more of the generated augmented fail data units AUG_FAIL_DU will be described.

Figure 5:
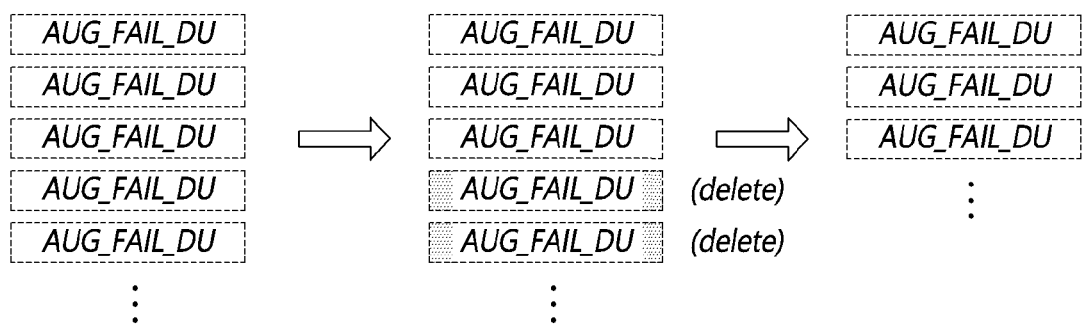
FIG. 5 is a diagram illustrating an operation in which a processor deletes one or more of a plurality of augmented fail data units according to an embodiment of the present disclosure.

FIG. 5 illustrates an operation in which a processor 120 deletes one or more of a plurality of augmented fail data units AUG_FAIL_DU according to an embodiment of the present disclosure.

Referring to FIG. 5, the processor 120 may delete one or more of the plurality of augmented fail data units AUG_FAIL_DU output from the above-described data augmentation model AUG_MDL.

The plurality of augmented fail data units AUG_FAIL_DU are not data actually obtained from the random access memory RAM, but are data virtually generated from the data augmentation model AUG_MDL.

Therefore, among the plurality of augmented fail data units AUG_FAIL_DU, there may be an augmented fail data unit that cannot occur in an actual random access memory. Therefore, in order to increase the accuracy of fail analysis, the processor 120 needs to filter out (i.e., screen out) the augmented fail data unit that cannot occur in an actual random access memory.

Hereinafter, a specific operation of the processor 120 deleting one or more of the plurality of augmented fail data units AUG_FAIL_DU will be described.

For example, the processor 120 may delete one or more of the augmented fail data units AUG_FAIL_DU based on the first parameter PARA_1, second parameter PARA_2 and third parameter PARA_3 of the plurality of augmented fail data units AUG_FAIL_DU. Hereinafter, this will be described in detail in FIGS. 6 to 8.

Figure 6:
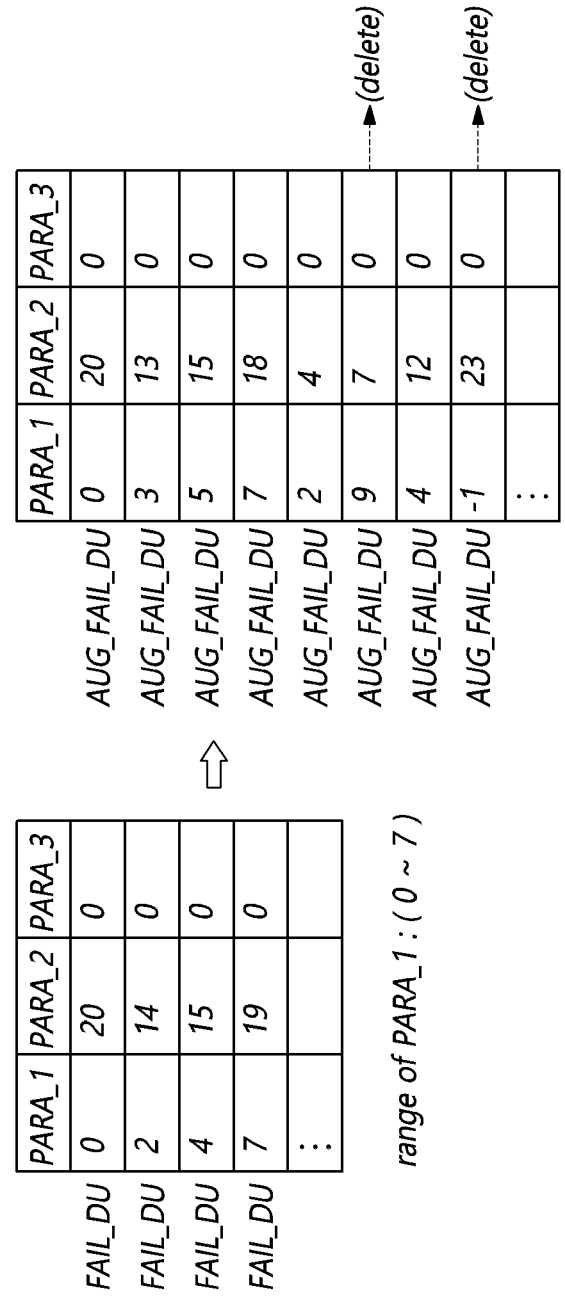
FIG. 6 is a diagram illustrating an operation in which a processor deletes one or more of a plurality of augmented fail data units based on a first parameter according to an embodiment of the present disclosure.

FIG. 6 illustrates an operation in which a processor 120 deletes one or more of a plurality of augmented fail data units AUG_FAIL_DU based on a first parameter PARA_1 according to an embodiment of the present disclosure.

The processor 120 may delete augmented fail data unit(s), among the plurality of augmented fail data units AUG_FAIL_DU, of which the first parameter PARA_1 is less than a first threshold or greater than a second threshold. In this case, the first threshold may be a minimum value among first parameters of the plurality of fail data units FAIL_DU, and the second threshold may be a maximum value among first parameters of the plurality of fail data units FAIL_DU.

In FIG. 6, the minimum value among first parameters of the plurality of fail data units FAIL_DU is 0, and the maximum value is 7. Therefore, the first threshold is 0 and the second threshold is 7.

The processor 120 may delete augmented fail data unit(s) whose first parameter PARA_1 is less than 0 or greater than 7 from among the plurality of augmented fail data units AUG_FAIL_DU.

In FIG. 6, the processor 120 may delete an augmented fail data unit whose first parameter PARA_1 is −1 and an augmented fail data unit whose first parameter PARA_1 is 9.

Figure 7:
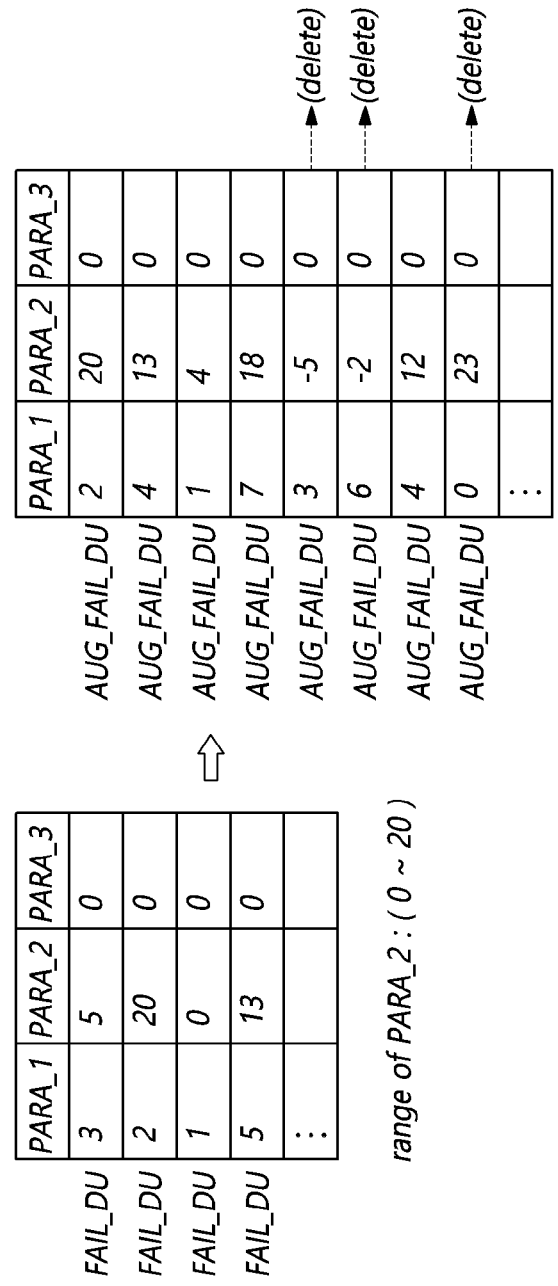
FIG. 7 is a diagram illustrating an operation in which a processor deletes one or more of a plurality of augmented fail data units based on a second parameter according to an embodiment of the present disclosure.

FIG. 7 illustrates an operation in which a processor 120 deletes one or more of a plurality of augmented fail data units AUG_FAIL_DU based on a second parameter PARA_2 according to an embodiment of the present disclosure.

The processor 120 may delete augmented fail data unit(s) among the plurality of augmented fail data units AUG_FAIL_DU, of which the second parameter PARA_2 is less than a third threshold or greater than a fourth threshold. The third threshold may be a minimum value among second parameters of the plurality of fail data units FAIL_DU, and the fourth threshold may be a maximum value among second parameters of the plurality of fail data units FAIL_DU.

In FIG. 7, the minimum value of the second parameters of the plurality of fail data units FAIL_DU is 0 and the maximum value is 20. Therefore, the third threshold is 0 and the fourth threshold is 20.

The processor 120 may delete an augmented fail data unit whose second parameter PARA_2 is less than 0 or greater than 20 from among the plurality of augmented fail data units AUG_FAIL_DU.

In FIG. 7, the processor 120 may delete augmented fail data unit whose second parameter PARA_2 is −5, augmented fail data unit whose second parameter PARA_2 is −2, and augmented fail data unit whose second parameter PARA_2 is 23.

FIG. 8 illustrates an operation in which a processor 120 deletes one or more of a plurality of augmented fail data units AUG_FAIL_DU based on a third parameter PARA_3 according to an embodiment of the present disclosure.

The processor 120 may delete augmented fail data unit(s), among the plurality of augmented fail data units AUG_FAIL_DU, of which the third parameter PARA_3 is different from third parameters of the plurality of fail data units FAIL_DU. The third parameters of the plurality of fail data units FAIL_DU is the same.

In FIG. 8, all third parameters of the plurality of fail data units FAIL_DU is 0.

Accordingly, the processor 120 may delete augmented fail data unit(s) among the plurality of augmented fail data units AUG_FAIL_DU, of which the third parameter PARA_3 is not 0. In FIG. 8, the processor 120 may delete an augmented fail data unit whose third parameter PARA_3 is 1 and an augmented fail data unit whose third parameter PARA_3 is −1.

Figure 9:
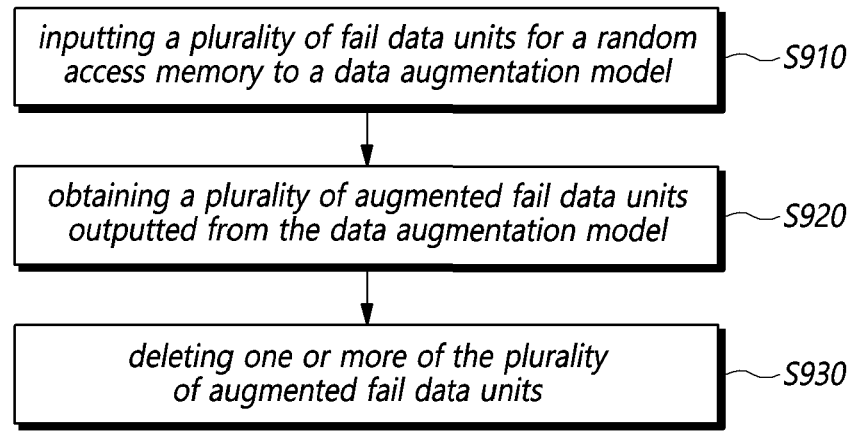
FIG. 9 is a flowchart illustrating a fail data augmentation method according to embodiments of the present disclosure.

FIG. 9 illustrates a fail data augmentation method 900 according to embodiments of the present disclosure.

Referring to FIG. 9, the fail data augmentation method 900 may include inputting the plurality of fail data units FAIL_DU for the random access memory RAM to the data augmentation model AUG_MDL (at operation S910). The data augmentation model AUG_MDL may be an artificial intelligence model that inputs the plurality of fail data units FAIL_DU and generates the plurality of augmented fail data units AUG_FAIL_DU based on the plurality of fail data units FAIL_DU.

The fail data augmentation method 900 may include obtaining the plurality of augmented fail data units AUG_FAIL_DU output from the data augmentation model AUG_MDL (at operation S920).

The fail data augmentation method 900 may include deleting one or more of the plurality of augmented fail data units AUG_MDL output from the data augmentation model AUG_MDL (at operation S930).

Each of the random access memory RAM may include the plurality of banks BANK. Each of the plurality of banks BANK may include the plurality of matrices MAT, and each of the plurality of matrices MAT may include the plurality of hex units HEX.

Each of the plurality of fail data units FAIL_DU and the plurality of augmented fail data units AUG_FAIL_DU may include the first parameter PARA_1, the second parameter PARA_2, and the third parameter PARA_3.

The first parameter PARA_1 may indicate one of the plurality of banks BANK in the random access memory RAM.

The second parameter PARA_2 may indicate one of the plurality of matrices MAT included in the bank corresponding to the first parameter PARA_1.

The third parameter PARA_3 may indicate one of the plurality of hex units HEX included in the matrix corresponding to the second parameter PARA_2.

The operation S930 may delete one or more of the plurality of augmented fail data units AUG_FAIL_DU based on the first parameter PARA_1, second parameter PARA_2 and third parameter PARA_3 of the plurality of augmented fail data units AUG_FAIL_DU.

For example, the operation S930 may include deleting augmented fail data unit(s) from among the plurality of augmented fail data units AUG_FAIL_DU, of which the first parameter PARA_1 is less than the first threshold or greater than the second threshold. In this case, the first threshold is a minimum value among first parameters of the plurality of fail data units FAIL_DU, and the second threshold is a maximum value among the first parameters of the plurality of fail data units FAIL_DU.

As another example, the operation S930 may include deleting augmented fail data unit(s) among the plurality of augmented fail data units AUG_FAIL_DU, of which the second parameter PARA_2 is less than the third threshold or greater than the fourth threshold. In this case, the third threshold is a minimum value among second parameters of the plurality of fail data units FAIL_DU, and the fourth threshold is a maximum value among second parameters of the plurality of fail data units FAIL_DU.

As another example, the operation S930 may include deleting augmented fail data unit(s) among the plurality of augmented fail data units AUG_FAIL_DU, in which the third parameter PARA_3 is different from third parameters of the plurality of fail data units FAIL_DU.

The fail data augmentation method 900 described above may be executed by the above-described fail data augmentation device 100, or a computing device having memory storing computer-readable software, an application, a program module, a routine, instructions, and/or data structures, coded to perform the fail data augmentation method 900.

Although various embodiments of the present disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the present disclosure is not limited by the embodiments and the accompanying drawings. The spirit and scope of the present disclosure should be interpreted in connection with the appended claims and encompass all equivalents falling within the scope of the appended claims. Furthermore, the embodiments may be combined to form additional embodiments.

What is claimed is:

1. A fail data augmentation device comprising:
a memory configured to store a plurality of fail data units for a target random access memory and a data augmentation model that inputs the plurality of fail data units and outputs a plurality of augmented fail data units; and
a processor configured to execute instructions for:
inputting the plurality of fail data units to the data augmentation model,
obtaining the plurality of augmented fail data units output from the data augmentation model, and
deleting one or more of the plurality of augmented fail data units,
wherein the target random access memory includes a plurality of banks,
wherein each of the plurality of banks includes a plurality of matrices,
wherein each of the plurality of matrices include a plurality of hex units, and
wherein each of the plurality of fail data units and the plurality of augmented fail data units includes a first parameter indicating one of the plurality of banks, a second parameter indicating one of the plurality of matrices included in the bank corresponding to the first parameter, and a third parameter indicating one of the plurality of hex units included in the matrix corresponding to the second parameter.

2. The fail data augmentation device according to claim 1, wherein the data augmentation model includes a Synthetic Minority Over-sampling Technique (SMOTE) model or a Generative Adversarial Network (GAN) model.

3. The fail data augmentation device according to claim 1, wherein each of the plurality of fail data units and the plurality of augmented fail data units includes at least one of a row address, a column address, channel information, main word line information, sub word line control signal, chip select information and data information.

4. The fail data augmentation device according to claim 1, wherein the processor is configured to execute an instruction for deleting one or more of the plurality of augmented fail data units based on the first parameter, second parameter and third parameter of the plurality of augmented fail data units.

5. The fail data augmentation device according to claim 4, wherein the processor is configured to execute an instruction for deleting one or more augmented fail data units, among the plurality of augmented fail data units, of which the first parameter is less than a first threshold or greater than a second threshold,
wherein the first threshold is a minimum value among first parameters of the plurality of fail data units, and
wherein the second threshold is a maximum value among first parameters of the plurality of fail data units.

6. The fail data augmentation device according to claim 5, wherein the processor is configured to execute an instruction for deleting one or more augmented fail data units among the plurality of augmented fail data units, of which the second parameter is less than a third threshold or greater than a fourth threshold,
wherein the third threshold is a minimum value among second parameters of the plurality of fail data units, and
wherein the fourth threshold is a maximum value among second parameters of the plurality of fail data units.

7. The fail data augmentation device according to claim 6, wherein the processor is configured to execute an instruction for deleting one or more augmented fail data units among the plurality of augmented fail data units, of which the third parameter is different from third parameters of the plurality of fail data units.

8. A fail data augmentation method comprising:
inputting a plurality of fail data units for a target random access memory to a data augmentation model;
obtaining a plurality of augmented fail data units output from the data augmentation model; and
deleting one or more of the plurality of augmented fail data units,
wherein the target random access memory includes a plurality of banks,
wherein each of the plurality of banks includes a plurality of matrices,
wherein each of the plurality of matrices include a plurality of hex units, and
wherein each of the plurality of fail data units and the plurality of augmented fail data units includes a first parameter indicating one of the plurality of banks, a second parameter indicating one of the plurality of matrices included in the bank corresponding to the first parameter, and a third parameter indicating one of the plurality of hex units included in the matrix corresponding to the second parameter.

9. The fail data augmentation method of claim 8, wherein the deleting one or more of the plurality of augmented fail data units comprises deleting one or more of the plurality of augmented fail data units based on the first parameter, second parameter and third parameter of the plurality of augmented fail data units.

10. The fail data augmentation method of claim 8, wherein the deleting one or more of the plurality of augmented fail data units comprises deleting one or more augmented fail data units among the plurality of augmented fail data units, of which the first parameter is less than a first threshold or greater than a second threshold,
wherein the first threshold is a minimum value among first parameters of the plurality of fail data units, and
wherein the second threshold is a maximum value among first parameters of the plurality of fail data units.

11. The fail data augmentation method of claim 10, wherein the deleting one or more of the plurality of augmented fail data units comprises deleting one or more augmented fail data units among the plurality of augmented fail data units, of which the second parameter is less than a third threshold or greater than a fourth threshold,
wherein the third threshold is a minimum value among second parameters of the plurality of fail data units, and
wherein the fourth threshold is a maximum value among second parameters of the plurality of fail data units.

12. The fail data augmentation method of claim 11, wherein the deleting one or more of the plurality of augmented fail data units comprises deleting one or more augmented fail data units, among the plurality of augmented fail data units, of which the third parameter is different from third parameters of the plurality of fail data units.

13. A fail data augmentation device comprising:
a memory configured to store a plurality of fail data units for a target random access memory and a data augmentation model; and a processor configured to:
- input a plurality of fail data units into a data augmentation model;
- obtain a plurality of augmented fail data units output from the data augmentation model, and
- delete one or more of the plurality of augmented fail data units, wherein the target random access memory includes several memory areas with a hierarchy, wherein each of the plurality of fail data units and the plurality of augmented fail data units includes several parameter values corresponding to respective memory areas, wherein the one or more of the plurality of augmented fail data units are deleted according to threshold ranges which are preset for each memory areas and each parameter value.

* * * * *